US011764458B2

(12) United States Patent
Choi et al.

(10) Patent No.: US 11,764,458 B2
(45) Date of Patent: Sep. 19, 2023

(54) ANTENNA PACKAGE AND IMAGE DISPLAY DEVICE INCLUDING THE SAME

(71) Applicant: DONGWOO FINE-CHEM CO., LTD., Jeollabuk-do (KR)

(72) Inventors: Byung Jin Choi, Incheon (KR); Na Yeon Kim, Seoul (KR); Young Ju Kim, Gyeonggi-do (KR); Han Sub Ryu, Gyeongsangbuk-do (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 144 days.

(21) Appl. No.: 17/526,240

(22) Filed: Nov. 15, 2021

(65) Prior Publication Data

US 2022/0158329 A1 May 19, 2022

(30) Foreign Application Priority Data

Nov. 17, 2020 (KR) ........................ 10-2020-0153886

(51) Int. Cl.
*H01Q 1/24* (2006.01)
*H01Q 1/22* (2006.01)
*H05K 1/00* (2006.01)
*H05K 1/11* (2006.01)

(52) U.S. Cl.
CPC ........... *H01Q 1/2283* (2013.01); *H01Q 1/243* (2013.01)

(58) Field of Classification Search
CPC ............ H01Q 1/24; H01Q 1/243; H01Q 1/38; H01Q 1/22; H01Q 1/2283; H01Q 21/00; H01Q 21/0006; H01Q 21/08; H01Q 9/04; H01Q 9/0407; H01Q 1/40; H01Q 1/422; H01Q 1/52; H05K 1/00; H05K 1/11; H05K 1/117; H05K 1/118; H05K 1/0224; H01R 12/71; H01R 12/57
See application file for complete search history.

(56) References Cited

U.S. PATENT DOCUMENTS

2013/0112754 A1* 5/2013 Ikemoto ............. G06K 7/10336 235/488
2019/0327834 A1* 10/2019 Kim ....................... H01Q 1/245
2020/0119452 A1* 4/2020 Kylkilahti ............ H05K 1/0277
2021/0242569 A1* 8/2021 Fujii ...................... H05K 3/361

FOREIGN PATENT DOCUMENTS

KR 10-2013-0095451 A 8/2013

* cited by examiner

*Primary Examiner* — Thai Pham
(74) *Attorney, Agent, or Firm* — The PL Law Group, PLLC

(57) ABSTRACT

An antenna package according to an embodiment of the present disclosure includes an antenna device including an antenna unit, and a first circuit board electrically connected to the antenna device. The first circuit board includes a first core layer, a first circuit wiring layer formed on one surface of the first core layer and electrically connected to the antenna unit, a first connector connected to an end portion of the first circuit wiring layer on the one surface of the first core layer, and a first shielding barrier disposed on the other surface opposite to the one surface of the first core layer. The first shielding barrier at least partially covers the first connector in a planar view.

19 Claims, 8 Drawing Sheets

ANTENNA PACKAGE AND IMAGE DISPLAY DEVICE INCLUDING THE SAME

CROSS-REFERENCE TO RELATED APPLICATION AND CLAIM OF PRIORITY

This application claims priority to Korean Patent Application No. 10-2020-0153886 filed on Nov. 17, 2020 in the Korean Intellectual Property Office (KIPO), the entire disclosures of which are incorporated by reference herein.

BACKGROUND

1. Field

The present invention relates to an antenna package and an image display device including the same. More particularly, the present invention relates to an antenna package including an antenna device and a circuit board and an image display device including the same.

2. Description of the Related Art

As information technologies have been developed, a wireless communication technology such as Wi-Fi, Bluetooth, etc., is combined with an image display device in, e.g., a smartphone form. In this case, an antenna may be combined with the image display device to provide a communication function.

According to developments of a mobile communication technology, an antenna capable of implementing, e.g., high frequency or ultra-high frequency band communication is needed in the display device.

However, if a driving frequency of the antenna increases, a signal loss may be increased, and as a length of a transmission path increases, a degree of the signal loss may be further increased.

To connect the antenna to a main board of the image display device, a connection intermediate structure such as a flexible printed circuit board or a connector may be added. In this case, the signal loss may be further increased by the connection intermediate structure.

Additionally, high frequency or ultra-high frequency radiation properties may be easily disturbed by an external noise around the antenna or the connection intermediate structure.

Accordingly, a construction of a circuit connection structure for obtaining reliability of electrical connectivity while maintaining or improving the radiation properties of the antenna may be needed.

For example, Korean Published Publication No. 2013-0095451 discloses an antenna integrated into a display panel, but does not suggest the efficient circuit connection as described above.

SUMMARY

According to an aspect of the present invention, there is provided an antenna package having improved electrical reliability and radiation efficiency.

According to an aspect of the present invention, there is provided an image display device including an antenna package with improved electrical reliability and radiation efficiency.

(1) An antenna package, including: an antenna device including an antenna unit; and a first circuit board electrically connected to the antenna device, the first circuit board including: a first core layer; a first circuit wiring layer formed on one surface of the first core layer and electrically connected to the antenna unit; a first connector connected to an end portion of the first circuit wiring layer on the one surface of the first core layer; and a first shielding barrier disposed on the other surface opposite to the one surface of the first core layer, the first shielding barrier at least partially covering the first connector in a planar view.

(2) The antenna package of the above (1), wherein the first circuit board further includes a first ground layer disposed on the other surface of the first core layer to overlap the first circuit wiring layer in a planar view.

(3) The antenna package of the above (2), wherein a thickness of the first shielding barrier is greater than a thickness of the first ground layer.

(4) The antenna package of the above (2), wherein the first ground layer and the first shielding barrier are integrally connected.

(5) The antenna package of the above (2), wherein the antenna unit includes a radiator, a transmission line extending from the radiator, a signal pad connected to a terminal portion of the transmission line, and a ground pad disposed around the signal pad and spaced apart from the transmission line and the signal pad.

(6) The antenna package of the above (5), wherein the first circuit wiring layer includes an antenna signal wiring electrically bonded to the signal pad and a bonding ground pad electrically bonded to the ground pad, respectively.

(7) The antenna package of the above (6), wherein the first circuit board further includes a first via structure passing through the first core layer and connecting the bonding ground pad and the first ground layer with each other.

(8) The antenna package of the above (2), wherein the first circuit board further includes a first cover-lay film covering the first ground layer, and the first shielding barrier is disposed on the first cover-lay film.

(9) The antenna package of the above (1), further including: a second circuit board electrically coupled to the first circuit board through the first connector of the first circuit board; and an antenna driving integrated circuit chip mounted on the second circuit board.

(10) The antenna package of the above (9), wherein the second circuit board includes: a second core layer; a second connector mounted on one surface of the second core layer and coupled to the first connector; a second circuit wiring layer connecting the second connector and the antenna driving IC chip with each other on the one surface of the second core layer; and a second shielding barrier disposed on the other surface opposite to the one surface of the second core layer, the second shielding barrier at least partially covering the second connector in a planar view.

(11) The antenna package of the above (10), wherein the second circuit board further includes a second ground layer disposed on the other surface of the second core layer to overlap the second circuit wiring layer in a planar view.

(12) The antenna package of the above (11), wherein a thickness of the second shielding barrier is greater than a thickness of the second ground layer.

(13) The antenna package of the above (11), wherein the second ground layer and the second shielding barrier are integrally connected.

(14) The antenna package of the above (11), wherein the second circuit board further includes a second cover-lay film covering the second ground layer, and the second shielding barrier is disposed on the second cover-lay film.

(15) The antenna package of the above (10), wherein the first connector and the second connector are coupled to each other to define a connector-combined structure, and the connector-combined structure is sandwiched by the first shielding barrier and the second shielding barrier.

(16) The antenna package of the above (10), wherein the first connector is a plug connector and the second connector is a receptacle connector.

(17) The antenna package of the above (10), wherein the first circuit board is a flexible printed circuit board and the second circuit board is a rigid printed circuit board.

(18) An image display device, including: a display panel; and the antenna package according to embodiments as described above disposed on the display panel.

(19) The image display device of the above (18), further including: a main board disposed under the display panel; and an antenna driving integrated circuit chip mounted on the main board, wherein the antenna package is bent under the display panel and is coupled to the main board through the first connector to be electrically connected to the antenna driving integrated circuit chip.

According to exemplary embodiments, a first circuit board bonded to an antenna device and a second circuit board on which an antenna driving integrated circuit chip is mounted may be electrically connected to each other through a connector. Accordingly, a bonding or attaching process for connecting the first and second circuit boards may be omitted, and a stable circuit board connection may be easily achieved.

In exemplary embodiments, a shielding barrier covering the connector in a planar view may be formed on the first circuit board and/or the second circuit board. A noise generated around the connector may be shielded by the shielding barrier and an electric field emitted to an outside may be blocked, thereby improving antenna radiation efficiency and reliability.

The shielding barrier may serve as a support pattern for enhancing stability of a connector junction, thereby further reducing a signal loss in a connector region.

DETAILED DESCRIPTION OF THE EMBODIMENTS

According to exemplary embodiments of the present invention, there is provided an antenna package including a connected structure of an antenna device and a connecting structure. According to exemplary embodiments of the present invention, there is also provided an image display device including the antenna package.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

Figure 1:
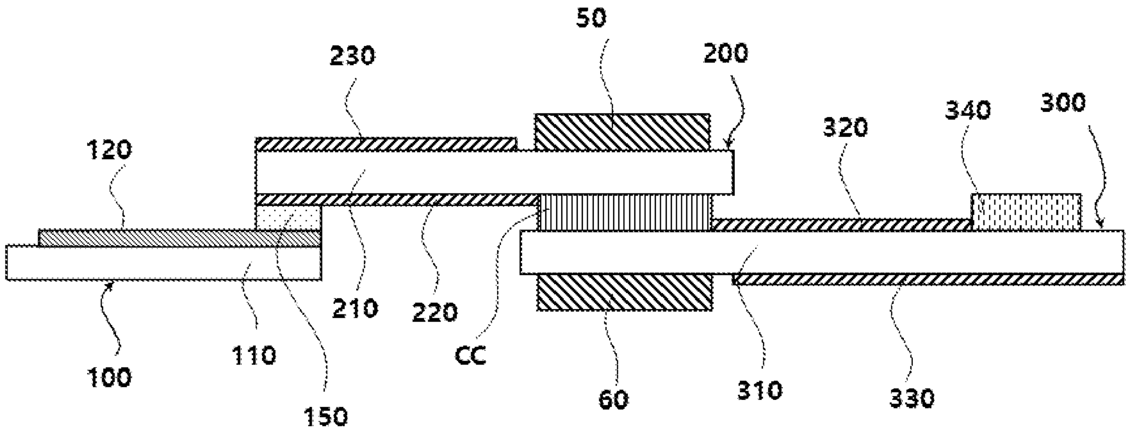
FIG. 1 is a schematic top planar view illustrating an antenna package in accordance with exemplary embodiments.

FIG. 1 is a schematic top planar view illustrating an antenna package in accordance with exemplary embodiments.

Referring to FIG. 1, an antenna package may include an antenna device 100, a first circuit board 200 and a second circuit board 300. The first circuit board 200 and the second circuit board 300 may be electrically connected to each other through a connector-combined structure CC.

The antenna device 100 may include an antenna dielectric layer 110 and an antenna layer 120 disposed on the antenna dielectric layer 110.

The antenna dielectric layer 110 may include a polyester-based resin such as polyethylene terephthalate, polyethylene isophthalate, polyethylene naphthalate and polybutylene terephthalate; a cellulose-based resin such as diacetyl cellulose and triacetyl cellulose; a polycarbonate-based resin; an acrylic resin such as polymethyl (meth)acrylate and polyethyl (meth)acrylate; a styrene-based resin such as polystyrene and an acrylonitrile-styrene copolymer; a polyolefin-based resin such as polyethylene, polypropylene, a cycloolefin or polyolefin having a norbornene structure and an ethylene-propylene copolymer; a vinyl chloride-based resin; an amide-based resin such as nylon and an aromatic polyamide; an imide-based resin; a polyethersulfone-based resin; a sulfone-based resin; a polyether ether ketone-based resin; a polyphenylene sulfide resin; a vinyl alcohol-based resin; a vinylidene chloride-based resin; a vinyl butyral-based resin; an allylate-based resin; a polyoxymethylene-based resin; an epoxy-based resin; a urethane or acrylic urethane-based resin; a silicone-based resin, etc. These may be used alone or in a combination of two or more therefrom.

In some embodiments, an adhesive film such as an optically clear adhesive (OCA) or an optically clear resin (OCR) may be included in the antenna dielectric layer 110. In some embodiments, the antenna dielectric layer 110 may include an inorganic insulating material such as silicon oxide, silicon nitride, silicon oxynitride, glass, or the like.

In some embodiments, a dielectric constant of the antenna dielectric layer 110 may be adjusted in a range from about 1.5 to about 12. When the dielectric constant exceeds about 12, a driving frequency may be excessively decreased, so that driving in a desired high or ultra-high frequency band may not be implemented.

Elements and structures of the antenna layer 120 will be described in detail with reference to FIG. 2.

The first circuit board 200 may include a first core layer 210 and a first circuit wiring layer 220 formed on one surface of the first core layer 210. A first ground layer 230 may be formed on the other surface opposite to the one surface of the first core layer 210.

The first circuit board 200 may be fabricated from, e.g., a flexible printed circuit board (FPCB).

The first core layer 210 may include a flexible resin. For example, the first core layer 210 may include a flexible resin such as a polyimide resin, a modified polyimide (MPI), an epoxy resin, polyester, a cycloolefin polymer (COP), a liquid crystal polymer (LCP), or the like. The first core layer 210 may include an internal insulating layer included in the first circuit board 200.

The first circuit wiring layer 220 may include a feeding wiring electrically connected to the antenna layer 120. The first circuit wiring layer 220 may be connected to or bonded to pads 126 and 128 (see FIG. 2) of the antenna layer 120. For example, one end portion of the first circuit wiring layer 220 may be exposed by partially removing a cover-lay film (not illustrated) of the first circuit board 200. The one end portion of the exposed first circuit wiring layer 220 may be bonded to the antenna layer 120 including the pad.

For example, the first circuit board 200 and the antenna device 100 may be bonded to each other through a heat treatment/pressurization process using a conductive bonding structure 150 such as an anisotropic conductive film (ACF).

The first ground layer 230 may be superimposed over the first circuit wiring layer 220 on the other surface of the first core layer 210 in a planar view.

In some embodiments, the antenna dielectric layer 110 may also serve as the first circuit board 200. In this case, the first circuit board 200 (e.g., the first core layer 210 of the circuit board 200) may be provided as a member substantially integral with the antenna dielectric layer 110. Further, the first circuit wiring layer 220 may be directly connected to the antenna layer 120.

The second circuit board 300 may be, e.g., a main board of an image display device, and may be a rigid printed circuit board. The second circuit board 300 may include a second core layer 310 and a second circuit wiring layer 320 formed on one surface of the second core layer 310. A second ground layer 330 may be formed on the other surface facing the one surface of the second core layer 310.

The second core layer 310 may include a material having a greater rigidity (modulus) and a lower ductility than those of the first core layer 210. For example, the second core layer 310 may include a resin (e.g., an epoxy resin) layer such as a prepreg impregnated with an inorganic material such as glass fiber. The second core layer 310 may include an internal insulating layer of the second circuit board 300.

An antenna driving IC chip 340 may be mounted on the one surface of the second core layer 310. The antenna driving IC chip 340 may be electrically connected to the second circuit wiring layer 320. A circuit device and a control device may be further mounted on the one surface of the second core layer 310. The circuit device may include, e.g., a capacitor such as a multi-layered ceramic capacitor (MLCC), an inductor, a resistor, or the like. The control device may include, e.g., a touch sensor driving IC chip, an application processor (AP) chip, or the like.

In exemplary embodiments, the first circuit board 200 and the second circuit board 300 may be electrically coupled to each other through the connector-combined structure CC. Constructions of the first circuit board 200 and the second circuit board 300 including the connector-combined structure CC will be described below in more detail with reference to FIGS. 3 and 4.

Feeding and applying control signals (e.g., phase, beam tilting signals, etc.) may be implemented from the antenna driving IC chip 340 to the antenna device 100 through the connector-combined structure CC.

Further, the first and second circuit boards 200 and 300 may be easily coupled to each other by using the connector-combined structure CC without an additional attaching process, or a bonding process such as a heating or pressing process.

Therefore, a dielectric loss due to a thermal damage and a resistance increase due to a wiring damage caused by the heating or pressing process may be prevented to suppress a signal loss of the antenna device 100.

In exemplary embodiments, the first circuit board 200 and/or the second circuit board 300 may further include a shielding barrier overlapping the connector-combined structure CC in a planar view or in a thickness direction.

For example, as illustrated in FIG. 1, a first shielding barrier 50 superimposed over the connector-combined structure CC may be disposed on the other surface of the first core layer 210 of the first circuit board. Further, a second shielding barrier 60 overlapping the connector-combined structure CC may be disposed on the other surface of the second core layer 310 of the second circuit board 300.

The shielding barriers 50 and 60 may include a conductive material capable of absorbing or shielding an electric noise or an electromagnetic wave noise. For example, the shielding barriers 50 and 60 may include a metallic material such as a steel use stainless (SUS) plate, a copper layer, a copper pattern, or the like.

As described above, the shielding barriers 50 and 60 may be disposed over and/or under the connector-combined structure CC. In some embodiments, the shielding barriers 50 and 60 may be disposed over and under the connector-combined structure CC to substantially sandwich the connector-combined structure CC. Accordingly, a signal loss generated from the connector-combined structure CC may be shielded.

Additionally, external radio waves and electrical noises may be blocked or absorbed by the shielding barriers 50 and 60 so that a feeding or a signal transmission of a desired frequency may be performed without a fluctuation between the first circuit board 200 and the second circuit board 300.

The shielding barriers 50 and 60 may function as a supporting plate of the connector-combined structure CC. Accordingly, damages to the circuit boards 200 and 300 due to a pressure applied when the first and second connectors 250 and 350 (see FIGS. 3 and 4) are coupled may be prevented.

In some embodiments, the first shielding barrier 50 may be disposed at the same layer or at the same level as that of the first ground layer 230, and may have a thickness greater than that of the first ground layer 230. The second shielding barrier 60 may be disposed at the same layer or at the same level as that of the second ground layer 330, and may have a thickness greater than that of the second ground layer 330.

The shielding barriers 50 and 60 may be formed to be relatively thicker than the adjacent conductive layers, so that noise and signal may be more effectively blocked in upper and/or lower regions of the connector-combined structure CC where a signal transmission may be concentrated.

Figure 2:
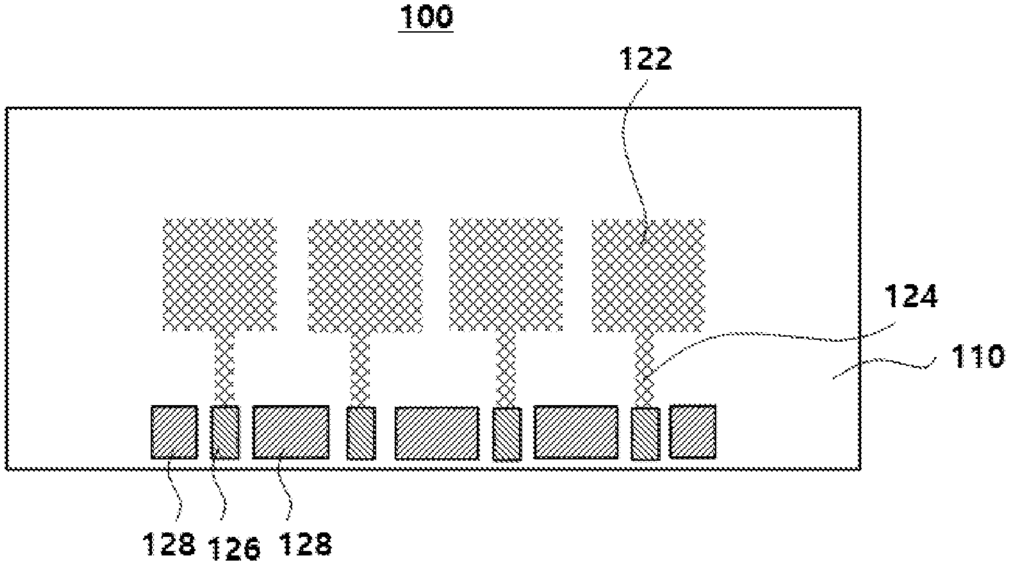
FIG. 2 is a schematic top planar view illustrating an antenna device included in an antenna package in accordance with exemplary embodiments.

FIG. 2 is a schematic top planar view illustrating an antenna device included in an antenna package in accordance with exemplary embodiments.

Referring to FIG. 2, as described above, the antenna device 100 may include the antenna layer 120 formed on the antenna dielectric layer 110, and the antenna layer 120 may include a plurality of antenna units.

The antenna units may be repeatedly arranged along a width direction of the antenna device 100 to form an antenna unit row. The antenna unit may include a radiator 122 and a transmission line 124.

The radiator 122 may have, e.g., a polygonal plate shape, and the transmission line 124 may extend from one side of the radiator 122. The transmission line 124 may be formed as a single member substantially integral with the radiator 122, and may have a narrower width than that of the radiator 122.

The antenna unit may further include a signal pad 126. The signal pad 126 may be connected to a terminal end portion of the transmission line 124. In an embodiment, the signal pad 126 may be provided as a member substantially integral with the transmission line 124, and the terminal end portion of the transmission line 124 may serve as the signal pad 126.

In some embodiments, a ground pad 128 may be disposed around the signal pad 126. For example, a pair of ground pads 128 may be disposed to face each other with the signal pad 126 interposed therebetween. The ground pad 128 may be electrically and physically separated from the transmission line 124 and the signal pad 126.

The antenna unit or the radiator 122 may be designed to have a resonance frequency corresponding to high frequency or ultra-high frequency band such as 3G, 4G, 5G or higher band. For example, the resonance frequency of the antenna unit may be about 10 GHz or more, or from about 20 GHz to 40 GHz.

In some embodiments, the radiators 122 having different sizes may be arranged on the antenna dielectric layer 110. In this case, the antenna device 100 may serve as a multi-radiation or multi-band antenna radiating in a plurality of resonance frequency bands.

The antenna unit may include silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), molybdenum (Mo), calcium (Ca) or an alloy containing at least one of the metals. These may be used alone or in combination thereof.

In an embodiment, the antenna unit may include silver (Ag) or a silver alloy (e.g., silver-palladium-copper (APC)), or copper (Cu) or a copper alloy (e.g., a copper-calcium (CuCa)) to implement a low resistance and a fine line width pattern.

In some embodiments, the antenna unit may include a transparent conductive oxide such as indium tin oxide (ITO), indium zinc oxide (IZO), zinc oxide (ZnOx), indium zinc tin oxide (IZTO), etc.

In some embodiments, the antenna unit may include a stacked structure of a transparent conductive oxide layer and a metal layer. For example, the antenna unit may include a double-layered structure of a transparent conductive oxide layer-metal layer, or a triple-layered structure of a transparent conductive oxide layer-metal layer-transparent conductive oxide layer. In this case, flexible property may be improved by the metal layer, and a signal transmission speed may also be improved by a low resistance of the metal layer. Corrosive resistance and transparency may be improved by the transparent conductive oxide layer.

In some embodiments, as illustrated in FIG. 2, the radiator 122 and the transmission line 124 may have a mesh-pattern structure to improve a transmittance. In this case, a dummy mesh pattern (not illustrated) may be formed around the radiator 122 and the transmission line 124.

The signal pad 126 and the ground pad 128 may be a solid pattern formed of the above-described metal or alloy in consideration of a feeding resistance reduction, a noise absorption efficiency, an improvement of horizontal radiation properties, etc.

In an embodiment, the radiator 122 may have a mesh-pattern structure, and at least a portion of the transmission line 124 may include a solid metal pattern.

The radiator 122 may be disposed in a display area of the image display device, and the signal pad 126 and the ground pad 128 may be disposed in a non-display area or a bezel area of the image display apparatus. At least a portion of the transmission line 124 may also be disposed in the non-display area or the bezel area.

Figure 3:
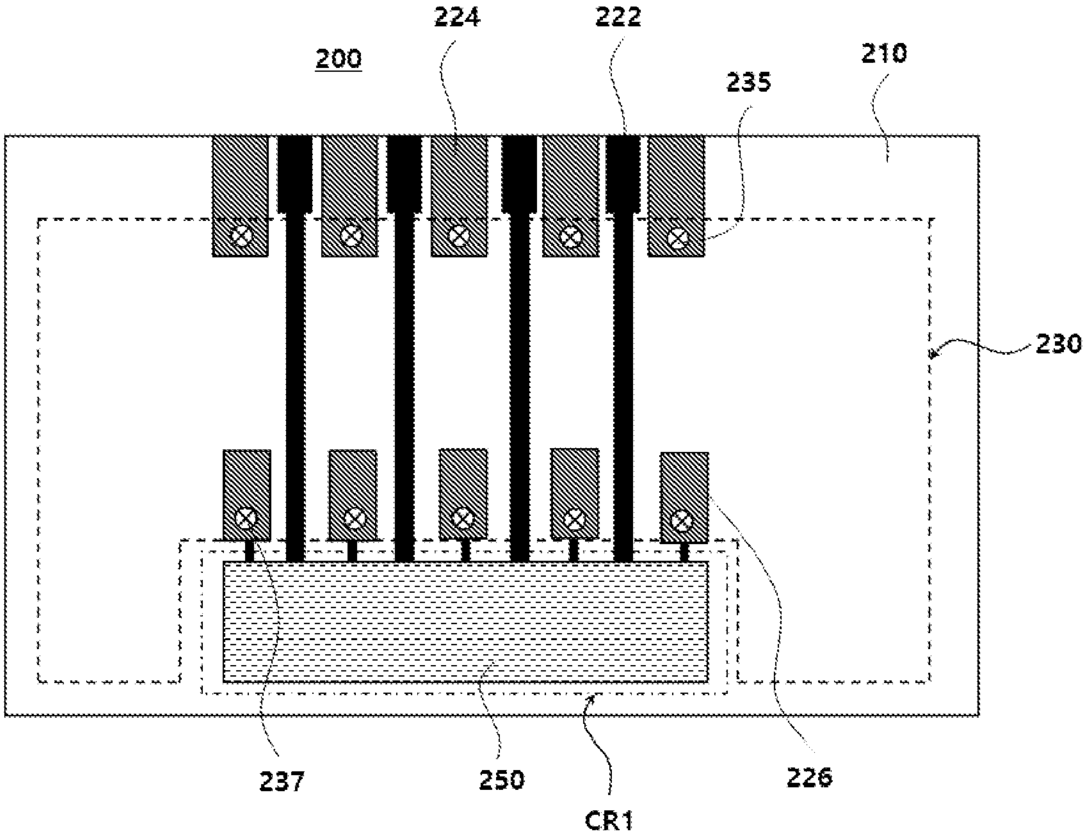
FIGS. 3 and 4 are schematic top planar views illustrating circuit boards in accordance with exemplary embodiments.
Figure 4:
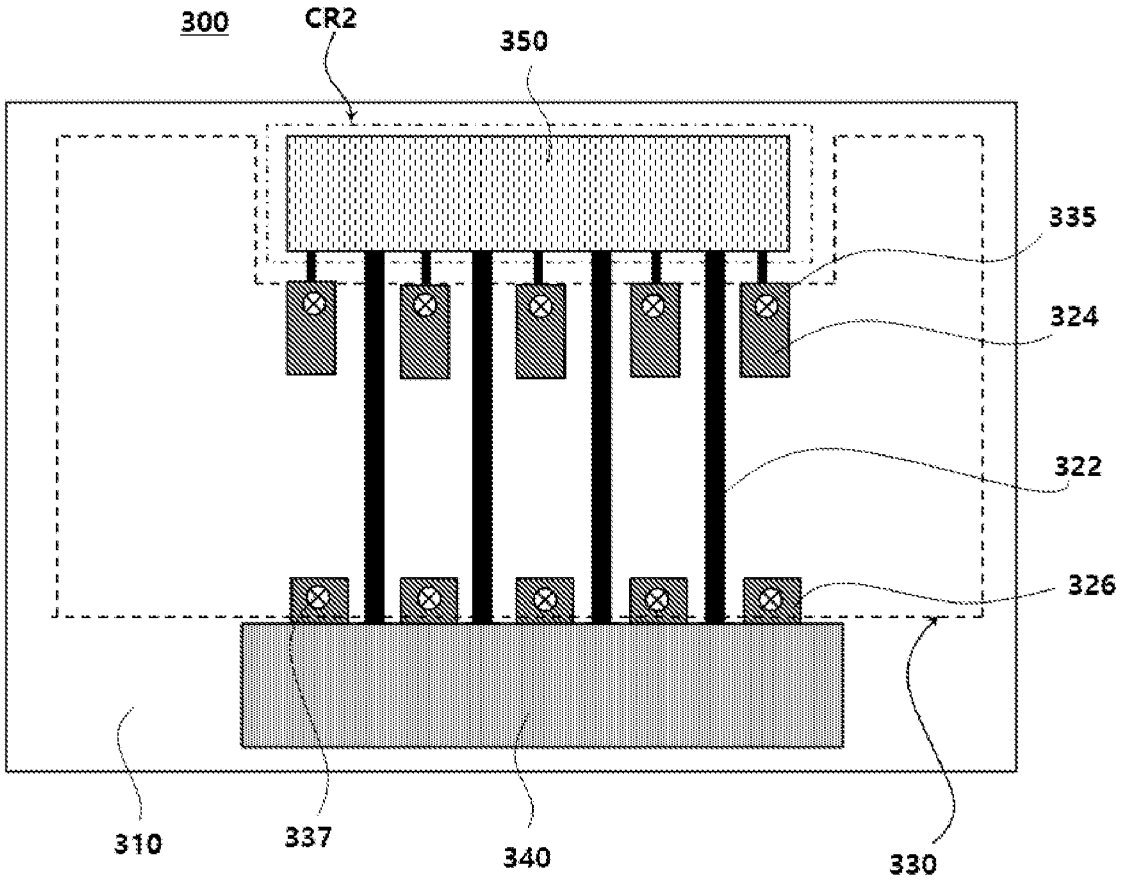

FIGS. 3 and 4 are schematic top planar views illustrating circuit boards in accordance with exemplary embodiments. Specifically, FIGS. 3 and 4 are schematic top planar views of a first circuit board and a second circuit board, respectively.

Referring to FIG. 3, as described with reference to FIG. 1, the first circuit board 200 may include the first circuit wiring layer 220 formed on one surface of the first core layer 210. The first circuit wiring layer 220 may include an antenna signal wiring 222.

The antenna signal wiring 222 may be electrically connected to the signal pad 126 of the antenna unit illustrated in FIG. 2. For example, one end portions of a plurality of the antenna signal wirings 222 may be individually connected to each of the signal pads 126.

The first circuit wiring layer 220 may further include a bonding ground pad 224 disposed around the one end portion of the antenna signal wiring 222. The bonding ground pad 224 may be disposed to correspond to the ground pad 128 of the antenna unit.

Accordingly, the antenna signal wirings 222 and the bonding ground pads 224 may be arranged to correspond to and be connected to the signal pads 126 and the ground pads 128 of the antenna unit, respectively.

For example, the conductive bonding structure 150 may be preliminarily bonded on the signal pads 126 and the ground pads 128 of the antenna unit, and then the antenna signal wirings 222 and the bonding ground pads 224 may be compressed on the conductive bonding structure 150.

The bonding ground pads 224 may be arranged around the antenna signal wiring 222, so that noises in a bonding area combined with the antenna device 100 may be shielded or absorbed. Additionally, a bonding adhesion and stability may be improved by the bonding ground pads 224.

The bonding ground pad 224 may be electrically connected to the first ground layer 230 through a first via structure 235 penetrating the first core layer 210.

Other end portions of the antenna signal wirings 222 may be electrically connected to the first connector 250. For example, the first connector 250 may be mounted on a first connector region CR1 of the first circuit board 200 to be electrically connected to terminal end portions of the antenna signal wirings 222 using a surface mount technology (SMT).

The first circuit wiring layer 220 may further include a first connector ground pad 226 disposed around the other end portions of the antenna signal wiring 222. Accordingly, a noise around the first connector 250 may be absorbed to improve signal transmission reliability.

The first connector ground pad 226 may be electrically connected to the first ground layer 230 through a second via structure 237 penetrating the first core layer 210.

The first ground layer 230 may be formed on the other surface of the first core layer 210 to overlap the antenna signal wirings 222 in a planar view. An electric field may be generated between the first ground layer 230 and the antenna signal wirings 222, so that efficiency of feeding and signal transmission to the antenna device 100 may be improved. Additionally, an external noise in a direction toward the other surface of the first circuit board 210 may be shielded by the first ground layer 230.

The first ground layer 230 may not overlap the first connector region CR1 in the planar view. As described above, according to exemplary embodiments, the first shielding barrier 50 may be disposed on the first connector region CR1 to at least partially cover the first connector region CR1 or the first connector 250.

Preferably, the first shielding barrier 50 may entirely cover the first connector region CR1 or the first connector 250 in the planar view.

Referring to FIG. 4, as described with reference to FIG. 1, the second circuit board 300 may include the second circuit wiring layer 320 formed on one surface of the second core layer 310. The second circuit wiring layer 320 may include a connector-chip connection wiring 322.

For example, one end portions of a plurality of the connector-chip connection wirings 322 may be connected to the second connector 350 to correspond to each of the signal pads 126 of the antenna units. Other end portions of the connector-chip connection wirings 322 may be electrically connected to the antenna driving IC chip 340.

The second circuit wiring layer 320 may further include a second connector ground pad 324 disposed around the one end portions of the connector-chip connection wirings 322.

The second connector ground pad 324 may be electrically connected to the second ground layer 330 through a third via structure 335 penetrating the second core layer 310.

The second connector 350 may be mounted on a second connector region CR2 of the second circuit board 300 using a surface mounting technology (SMT) to be electrically connected to one end portions of the connector-chip connection wirings 322.

The second circuit wiring layer 320 may further include a chip ground pad 326 disposed around the other end portion of the connector-chip connection wiring 322. Accordingly, a noise around the antenna driving IC chip 340 may be absorbed to improve reliability of feeding/control signal transmission.

The chip ground pad 326 may be electrically connected to the second ground layer 330 through a fourth via structure 337 penetrating the second core layer 310.

A second ground layer 330 may be formed on the other surface of the second core layer 310 to overlap the connector-chip connection wirings 322 in a planar view.

An electric field may be generated between the second ground layer 330 and the connector-chip connecting wirings 322, so that efficiency of feeding and signal transmission to the antenna device 100 and the first circuit board 200 may be improved. Further, an external noise from a lower portion of the second circuit board 300 may be shielded by the second ground layer 330.

The second ground layer 330 may not overlap the second connector region CR2 in the planar view. As described above, according to exemplary embodiments, the second shielding barrier 60 may be disposed on the second connector region CR2 to at least partially cover the second connector region CR2 or the second connector 350.

Preferably, the second shielding barrier 60 may entirely cover the first connector region CR2 or the second connector 350 in the planar view.

The circuit wiring layer and the ground layer included in the first and second circuit boards 200 and 300 may include a conductive material including the aforementioned metal or alloy.

Figure 5:
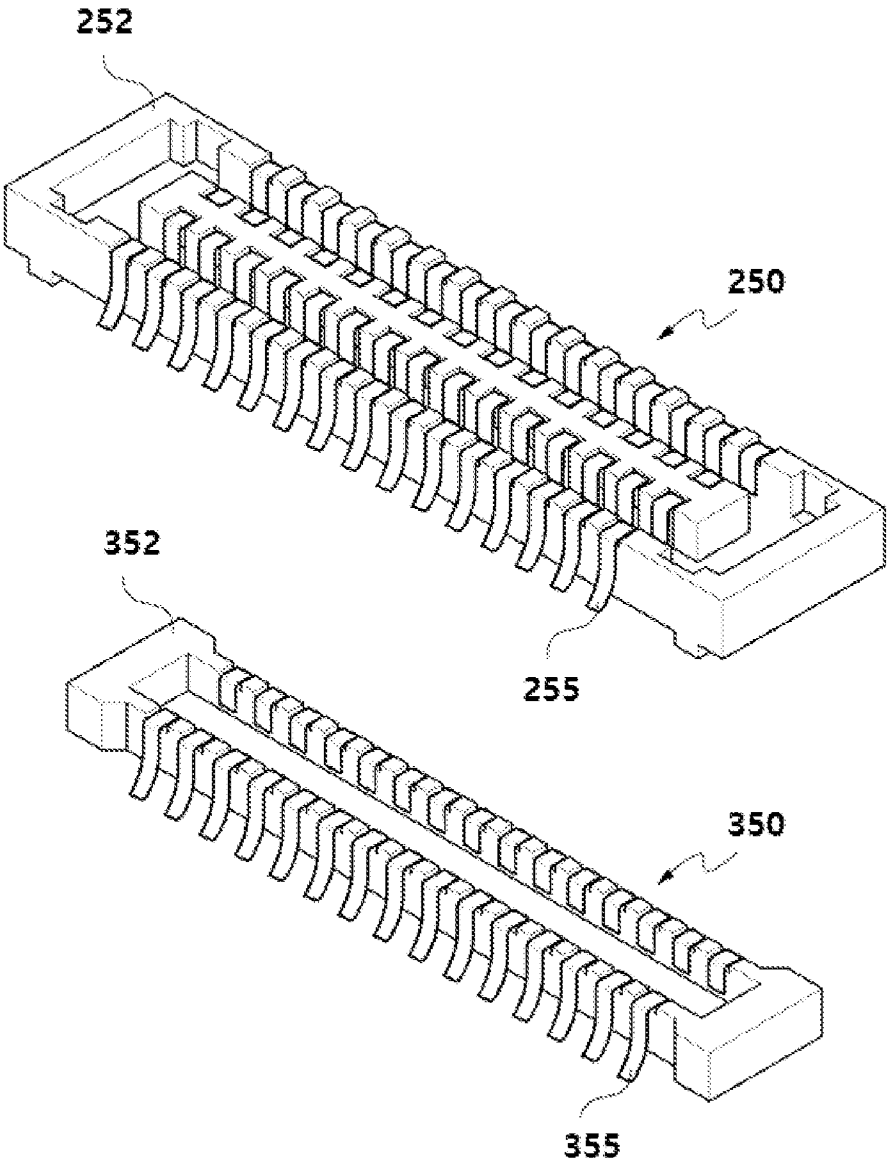
FIG. 5 is a schematic view illustrating a connector included in an antenna package in accordance with exemplary embodiments.

FIG. 5 is a schematic view illustrating a connector included in an antenna package in accordance with exemplary embodiments.

Referring to FIG. 5, the first connector 250 and the second connector 350 may be coupled to each other to form the connector-combined structure CC illustrated in FIG. 1. In some embodiments, the first connector 250 and the second connector 350 may be coupled in a board-to-board (B2B) structure to form the connector-combined structure CC.

For example, the first connector 250 may serve as a plug connector or a male connector, and the second connector 350 may serve as a receptacle connector or a female connector.

The first connector 250 may include a first insulator 252 and first conductive connection structures 255, and the second connector 350 may include a second insulator 352 and second conductive connection structures 355.

The insulators 252 and 352 may serve as a substrate or a body of the connector, and may provide an insulating barrier between the conductive connection structures 252 and 352. The conductive connection structures 255 and 355 may include terminal leads protruding to an outside of the insulators 252 and 352 and connection patterns between the insulating barriers provided by the insulators 252 and 352.

The terminal leads included in the first connector 250 may be connected to the antenna signal wirings 222 formed in the first circuit board 210 by a welding, a soldering, etc., and the terminal leads included in the second connector 350 may be connected to the connector-chip connection wirings 322 included in the second circuit board 300 by a welding, a soldering, etc. The first connector 250 may be coupled to the second connector 350, so that the connection patterns may contact each other to be connected with each other.

In an embodiment, the insulators 252 and 352 may include an insulating material having a dielectric constant (Dk) in a range from 2 to 3.5, and a loss tangent (Df, or dielectric loss) in a range from 0.0015 to 0.007.

Within the above range, for example, signal loss and gain reduction in the connector-combined structure (CC) may be prevented, and sufficient radiation properties of the antenna units may be achieved in a communication band of a high-frequency or ultra-high frequency range of 20 GHz or more.

In some embodiments, the insulators 252 and 352 may include a liquid crystal polymer (LCP) structure, a polyphenylene sulfide (PPS) structure and/or a modified polyimide (MPI) structure.

Figure 6:
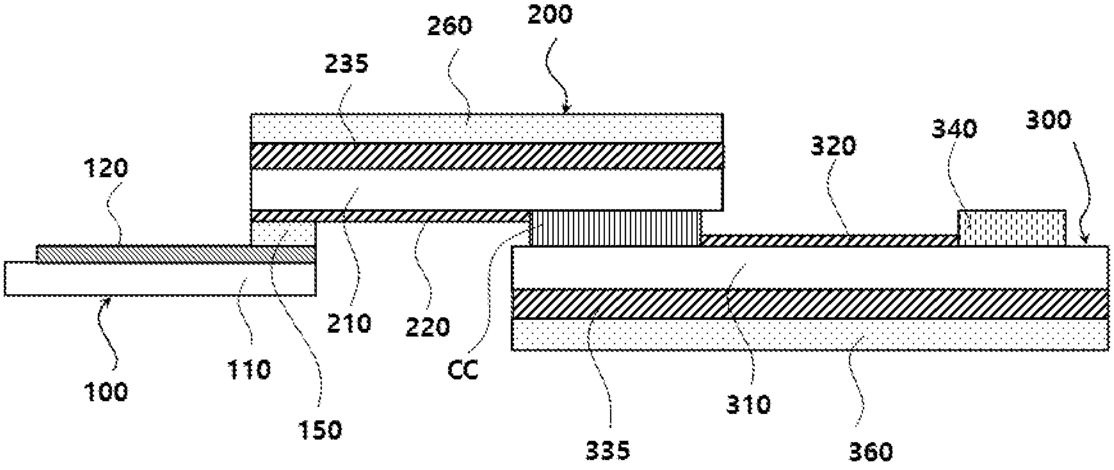
FIGS. 6 and 7 are schematic cross-sectional views illustrating an antenna package in accordance with some exemplary embodiments.
Figure 7:
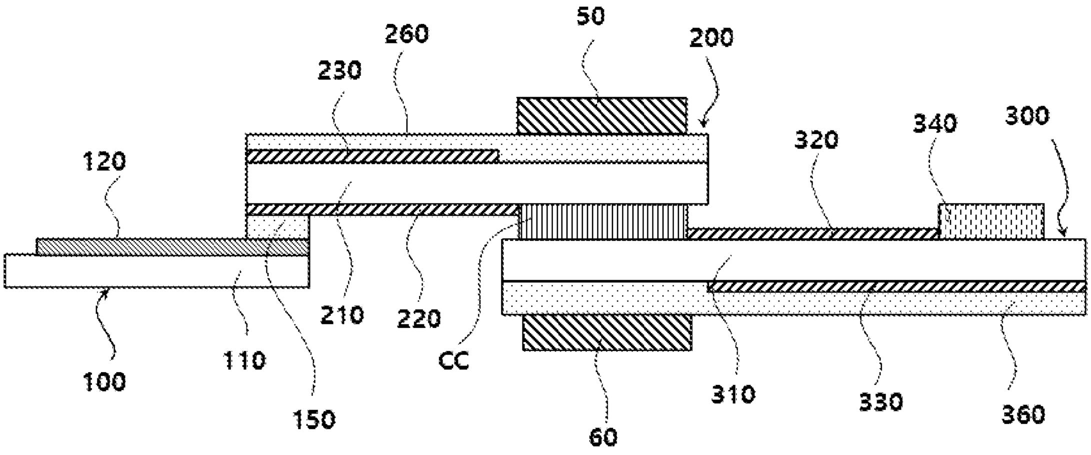

FIGS. 6 and 7 are schematic cross-sectional views illustrating an antenna package in accordance with some exemplary embodiments. Detailed descriptions on structures and elements substantially the same as or similar to those described with reference to FIGS. 1 to 5 will be omitted.

Referring to FIG. 6, the shielding barrier and the ground layer illustrated in FIG. 1 may be substantially formed as a single layer. Accordingly, the first circuit board 200 may include a first shielding ground layer 235 which may be disposed on the other surface of the first core layer 210 to overlap the first circuit wiring layer 220 and the connector-combined structure CC (or the first connector 250).

The second circuit board 300 may include a second shielding ground layer 335 that may be disposed on the other surface of the second core layer 310 to overlap the second circuit wiring layer 320 and the connector-combined structure CC (or the second connector 350).

In some embodiments, the first circuit board 200 may further include a first cover-lay film 260 covering the first shielding ground layer 235. The second circuit board 300 may further include a second cover-lay film 360 covering the second shielding ground layer 335.

The cover-lay film may also be formed on the first circuit wiring layer 220 and the second circuit wiring layer 320.

Referring to FIG. 7, the shielding barriers 50 and 60 may be disposed on the cover-lay films 260 and 360.

For example, the first cover-lay film 260 may be formed to cover the first ground layer 230 on the other surface of the first core layer 210. The first shielding barrier 50 may be disposed on the first cover-lay film 260 to overlap the connector-combined structure CC or the first connector 250.

The second cover-lay film 360 may be formed to cover the second ground layer 330 on the other surface of the second core layer 310. The second shielding barrier 60 may be disposed on the second cover-lay film 360 to overlap the connector-combined structure CC or the second connector 350.

Figure 8:
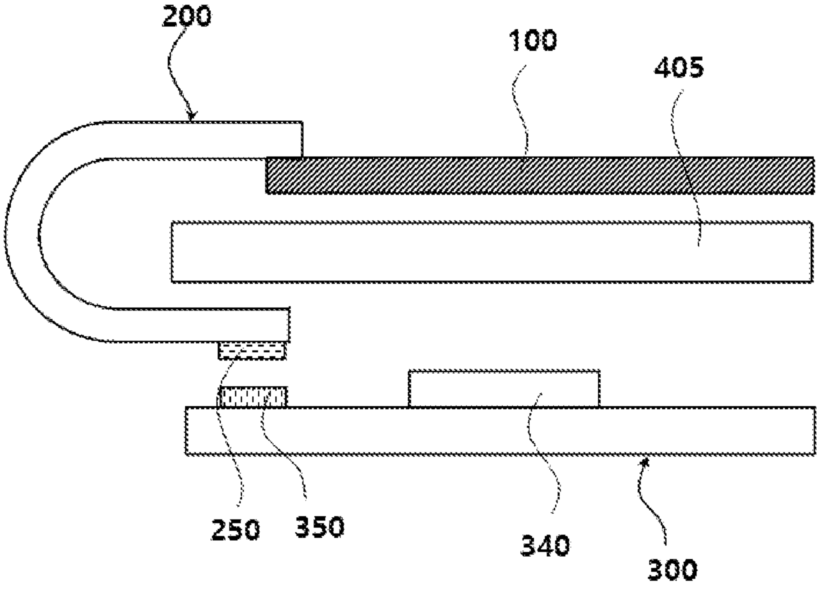
FIGS. 8 and 9 are a schematic cross-sectional view and a top planar view, respectively, illustrating an image display device in accordance with exemplary embodiments.
Figure 9:
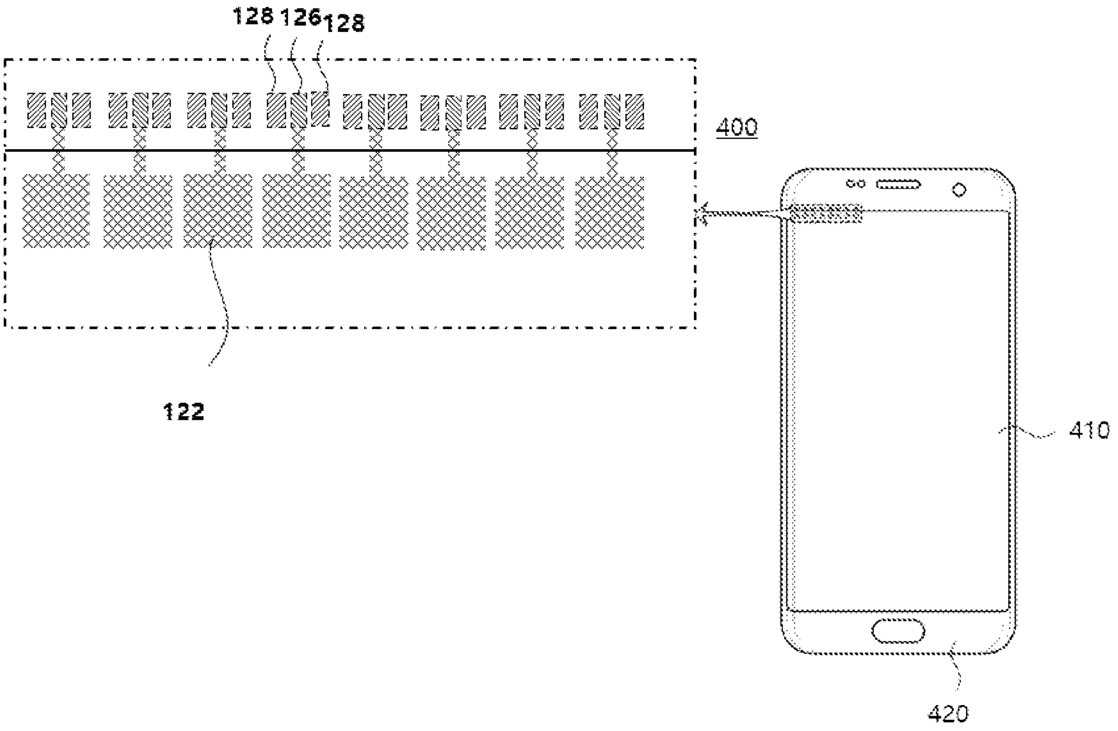

FIGS. 8 and 9 are a schematic cross-sectional view and a top planar view, respectively, illustrating an image display device in accordance with exemplary embodiments. For convenience of descriptions, illustration of detailed elements included in the antenna device 100, the first circuit board and the second circuit board are omitted herein.

Referring to FIGS. 8 and 9, an image display device 400 may be fabricated in the form of, e.g., a smart phone, and FIG. 9 illustrates a front portion or a window surface of the image display device 400. The front portion of the image display apparatus 400 may include a display area 410 and a peripheral area 420. The peripheral area 420 may correspond to, e.g., a light-shielding area or a bezel area of the image display device.

The antenna device 100 included in the above-described antenna package may be disposed toward the front portion of the image display device 400. For example, the antenna device 100 may be disposed on a display panel 405. In an embodiment, the radiator 122 may at least partially disposed in the display area 410 in a planar view.

In this case, the radiator 122 may include a mesh-pattern structure, and a decrease of transmittance due to the radiator 122 may be prevented. The pads 126 and 128 included in the antenna unit may be formed as a solid metal pattern, and may be disposed in the peripheral area 420 to prevent degradation of an image quality.

In some embodiments, the first circuit board 200 may be bent and disposed at a rear portion of the image display device 400 to extend toward the second circuit board 300 on which the antenna driving IC chip 340 is mounted.

The first circuit board 200 and the second circuit board 300 are interconnected through connectors 250 and 350 to implement a feeding and an antenna driving control to the antenna device 100 from the antenna driving IC chip.

As described above, the connector 250 and 350 may be used to stably provide the circuit connection by the bending, and the high-frequency or ultra-high frequency antenna may be efficiently applied in the image display device 400 while suppressing a signal loss by using the shielding barrier.

Figure 10:
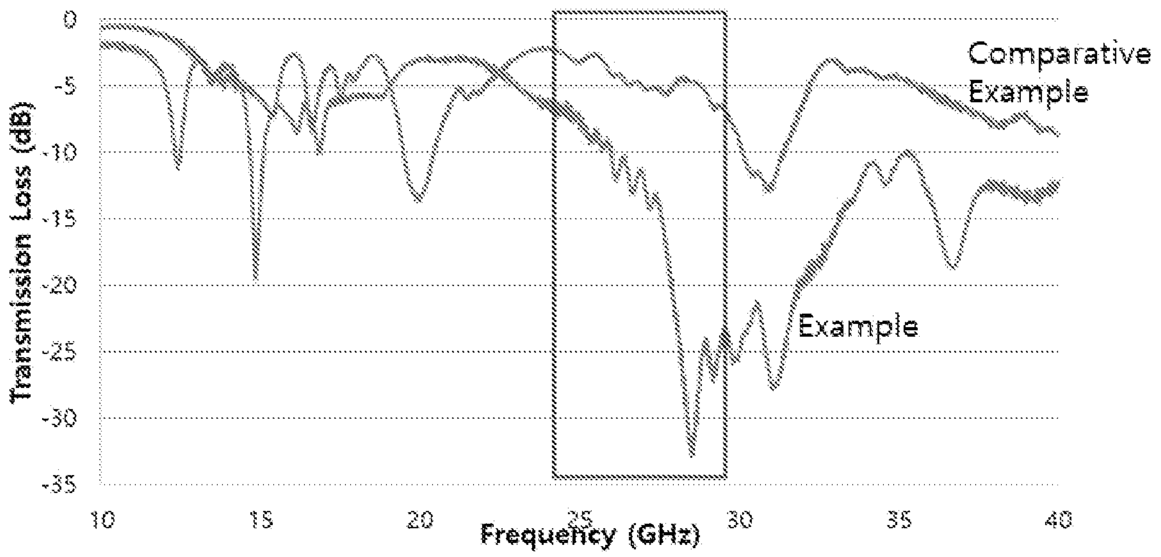
FIG. 10 is a graph showing signal loss simulation results from antenna packages of Example and Comparative Example.

FIG. 10 is a graph showing signal loss simulation results from antenna packages of Example and Comparative Example.

Specifically, in Example, a signal loss (transmission loss, S21) according to a frequency was simulated using an antenna package in which shielding barriers formed of an SUS material covering the connector regions CR1 and CR2 were disposed as illustrated in FIGS. 3 and 4. In Comparative Example, the signal loss was simulated using an antenna package the same as that of Example except that the shielding barriers were omitted.

As shown in FIG. 10, the signal loss was remarkably decreased when using the antenna package of Example in a frequency of 20 GHz or more.

What is claimed is:

1. An antenna package, comprising:
- an antenna device comprising an antenna unit; and
- a first circuit board electrically connected to the antenna device, the first circuit board comprising:
  - a first core layer;
  - a first circuit wiring layer formed on one surface of the first core layer and electrically connected to the antenna unit;
  - a first connector connected to an end portion of the first circuit wiring layer on the one surface of the first core layer; and
  - a first shielding barrier disposed on the other surface opposite to the one surface of the first core layer, the first shielding barrier at least partially covering the first connector in a planar view.

2. The antenna package of claim 1, wherein the first circuit board further comprises a first ground layer disposed on the other surface of the first core layer to overlap the first circuit wiring layer in a planar view.

3. The antenna package of claim 2, wherein a thickness of the first shielding barrier is greater than a thickness of the first ground layer.

4. The antenna package of claim 2, wherein the first ground layer and the first shielding barrier are integrally connected.

5. The antenna package of claim 2, wherein the antenna unit comprises a radiator, a transmission line extending from the radiator, a signal pad connected to a terminal portion of the transmission line, and a ground pad disposed around the signal pad and spaced apart from the transmission line and the signal pad.

6. The antenna package of claim 5, wherein the first circuit wiring layer comprises an antenna signal wiring electrically bonded to the signal pad and a bonding ground pad electrically bonded to the ground pad, respectively.

7. The antenna package of claim 6, wherein the first circuit board further comprises a first via structure passing through the first core layer and connecting the bonding ground pad and the first ground layer with each other.

8. The antenna package of claim 2, wherein the first circuit board further comprises a first cover-lay film covering the first ground layer; and
- the first shielding barrier is disposed on the first cover-lay film.

9. The antenna package of claim 1, further comprising:
- a second circuit board electrically coupled to the first circuit board through the first connector of the first circuit board; and
- an antenna driving integrated circuit chip mounted on the second circuit board.

10. The antenna package of claim 9, wherein the second circuit board comprises:
- a second core layer;
- a second connector mounted on one surface of the second core layer and coupled to the first connector;
- a second circuit wiring layer connecting the second connector and the antenna driving IC chip with each other on the one surface of the second core layer; and
- a second shielding barrier disposed on the other surface opposite to the one surface of the second core layer, the second shielding barrier at least partially covering the second connector in a planar view.

11. The antenna package of claim 10, wherein the second circuit board further comprises a second ground layer disposed on the other surface of the second core layer to overlap the second circuit wiring layer in a planar view.

12. The antenna package of claim 11, wherein a thickness of the second shielding barrier is greater than a thickness of the second ground layer.

13. The antenna package of claim 11, wherein the second ground layer and the second shielding barrier are integrally connected.

14. The antenna package of claim 11, wherein the second circuit board further comprises a second cover-lay film covering the second ground layer; and the second shielding barrier is disposed on the second cover-lay film.

15. The antenna package of claim 10, wherein the first connector and the second connector are coupled to each other to define a connector-combined structure, and the connector-combined structure is sandwiched by the first shielding barrier and the second shielding barrier.

16. The antenna package of claim 10, wherein the first connector is a plug connector and the second connector is a receptacle connector.

17. The antenna package of claim 10, wherein the first circuit board is a flexible printed circuit board and the second circuit board is a rigid printed circuit board.

18. An image display device, comprising:

a display panel; and the antenna package of claim 1 disposed on the display panel.

19. The image display device of claim 18, further comprising:

a main board disposed under the display panel; and an antenna driving integrated circuit chip mounted on the main board, wherein the antenna package is bent under the display panel and is coupled to the main board through the first connector to be electrically connected to the antenna driving integrated circuit chip.

* * * * *